(12) United States Patent
Shin et al.

(10) Patent No.: US 6,777,348 B2
(45) Date of Patent: Aug. 17, 2004

(54) METHOD OF FORMING OXYNITRIDE FILM

(75) Inventors: Seung Woo Shin, Ichon-Shi (KR); Cha Deok Dong, Ichon-Shi (KR)

(73) Assignee: Hynix Semiconductor Inc., Kyungki-do (KR)

( * ) Notice: Subject to any disclaimer, the term of this patent is extended or adjusted under 35 U.S.C. 154(b) by 0 days.

(21) Appl. No.: 10/631,362

(22) Filed: Jul. 31, 2003

(65) Prior Publication Data

US 2004/0127063 A1 Jul. 1, 2004

(30) Foreign Application Priority Data

Dec. 26, 2002 (KR) ................................ 10-2002-0084328

(51) Int. Cl.[7] ........................ H01L 21/31; H01L 21/469
(52) U.S. Cl. ........................ 438/775; 438/769; 438/770
(58) Field of Search ................................ 438/769, 770, 438/775

(56) References Cited

U.S. PATENT DOCUMENTS 6,130,146 A * 10/2000 Chang et al. ............... 438/592
6,458,714 B1 * 10/2002 Powell et al. ............... 438/770
6,468,926 B1 * 10/2002 Irino et al. .................. 438/773

* cited by examiner

Primary Examiner—Alexander Ghyka
(74) Attorney, Agent, or Firm—Marshall, Gerstein & Borun LLP

(57) ABSTRACT

Disclosed is a method of forming an oxynitride film. The method comprises the steps of loading a silicon substrate into an oxidization furnace, implanting an oxygen based source gas into the oxidization furnace to grow a pure silicon oxide film on the silicon substrate, blocking implantation of the oxygen based source gas and implanting an inert gas to exhaust the oxygen based source gas remaining within the oxidization furnace, raising a temperature within the oxidization furnace to a nitrification process temperature, stabilizing the temperature within the oxidization furnace, implementing a nitrification process for the pure silicon oxide film by implanting a nitrogen based source gas, and stopping implantation of the nitrogen based source gas and rapidly cooling the oxidization furnace while implanting the inert gas into the oxidization furnace.

5 Claims, 3 Drawing Sheets

METHOD OF FORMING OXYNITRIDE FILM

BACKGROUND OF THE INVENTION

1. Technical Field

A method of fabricating semiconductor devices, and more particularly, to an oxynitride film is disclosed.

2. Background of the Related Art

A silicon oxide film (hereinafter called 'pure silicon oxide film') in which a silicon substrate is oxidized within the oxidization furnace using a mixed gas of an oxygen ($O_2$) gas or $H_2O$ and $O_2$ has been used as a tunnel oxide film of the flash memory device. As the effective thickness of the tunnel oxide film required along with micronization of the device is reduced, however, it becomes difficult to satisfy the characteristic of the film required in the device with only the characteristic of the pure silicon oxide film.

Meanwhile, if the pure silicon oxide film is replaced by the oxynitride film, it is possible to secure characteristics of the film that were not satisfied by the pure silicon oxide film (for example, stress induced leakage current, the electric charge necessary for breakdown, the life of the film, etc.). This oxynitride film may be fabricated by a method by which the pure silicon oxide film of a give thickness is grown and a nitrification process is then implemented using $NH_3$, $N_2O$, NO, or the like to form a thin nitrogen layer at the existing silicon (Si)-silicon oxide ($SiO_2$) film interface or a nitrogen-rich oxide film. If the nitrogen layer is formed at the Si—$SiO_2$ interface by this method, the intrinsic properties of the film itself are improved but the concentration of the trap charge is increased in proportion to the concentration of nitrogen. For this reason, the carrier mobility in the channel of the transistor formed underlying it is influenced to change the threshold voltage of the transistor.

In particular, in case of NMOS, if the oxynitride film is used as the tunnel oxide film, the threshold voltage is dropped over 100 mV compared with the pure silicon oxide film even where the concentration of nitrogen at the Si—$SiO_2$ interface is about 1 atomic %. Thus, it is difficult to secure the desired transistor characteristic. FIG. 1 is a graph illustrating the difference in the threshold voltage at the transistor using the pure silicon oxide film and the oxynitride film as the dielectric film. In FIG. 1, 'a' indicates a case where the pure silicon oxide film is used as the dielectric film, and 'b' and 'c' indicate cases where the oxynitride film is used as the dielectric film. From FIG. 1, it could be seen that if the oxynitride film is used as the tunnel oxide film, the threshold voltage is dropped about 110 mV compared with the pure silicon oxide film when the concentration of nitrogen at the Si—$SiO_2$ interface is dropped about 1.437 atomic %.

SUMMARY OF THE DISCLOSURE

A method of forming an oxynitride film is disclosed which is capable of securing the characteristics of a film that are significantly improved than the characteristics of a film obtained in a pure silicon oxide film and minimizing variation in the threshold voltage of a transistor by a trap charge.

A disclosed method of fabricating an oxynitride film comprises loading a silicon substrate into an oxidization furnace, injecting an oxygen based source gas into the oxidization furnace to grow a pure silicon oxide film on the silicon substrate, stopping the injection of the oxygen based source gas and injecting an inert gas to exhaust or purge the oxygen based source gas remaining within the oxidization furnace, raising the temperature within the oxidization furnace to a nitrification process temperature, stabilizing the temperature within the oxidization furnace, implementing a nitrification process for the pure silicon oxide film by injecting a nitrogen based source gas, and stopping the injection of the nitrogen based source gas and heating the oxidation furnace to a higher temperature before rapidly cooling the oxidization furnace while injecting the inert gas into the oxidization furnace.

It is to be understood that both the foregoing general description and the following detailed description are exemplary and explanatory and are intended to provide further explanation of the claims.

BRIEF DESCRIPTION OF THE DRAWINGS

The above and other features and advantages of the disclosed method will be apparent from the following detailed description of the preferred embodiments in conjunction with the accompanying drawings, in which.

DETAILED DESCRIPTION OF THE PREFERRED EMBODIMENT

Reference will now be made in detail to the preferred embodiments of the disclosed methods, examples of which are illustrated in the accompanying drawings.

Figure 1:
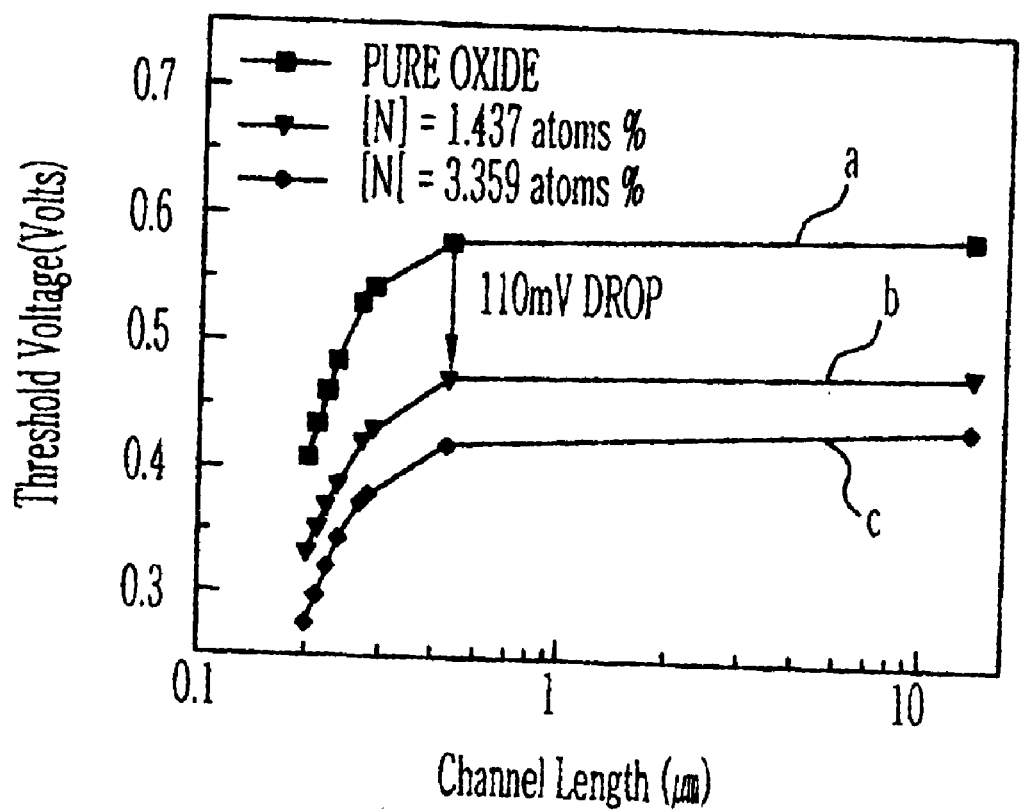
FIG. 1 is a graph illustrating the difference in the threshold voltage at a transistor using a pure silicon oxide film and an oxynitride film as a dielectric film.
Figure 2:
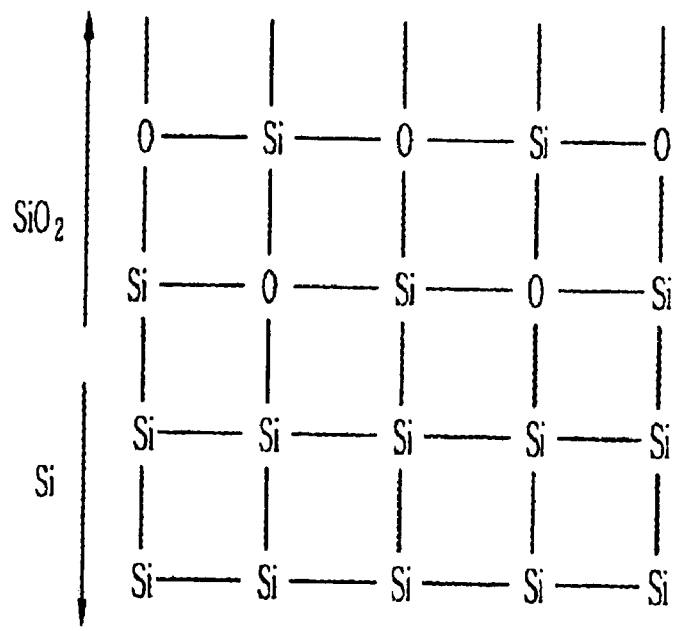
FIG. 2 illustrates that a silicon oxide ($SiO_2$) film is formed on a silicon substrate.
Figure 3:
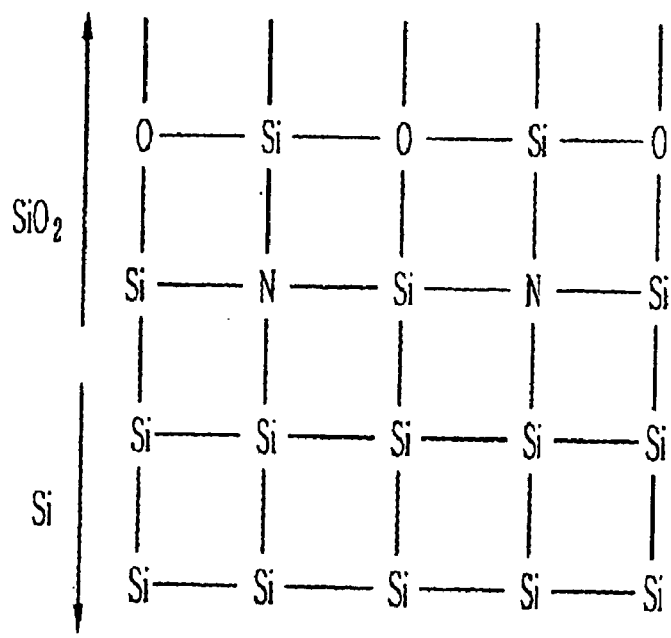
FIG. 3 illustrates that nitrogen is stably substituted at a Si—$SiO_2$ interface by implementing a nitrification process.
Figure 4:
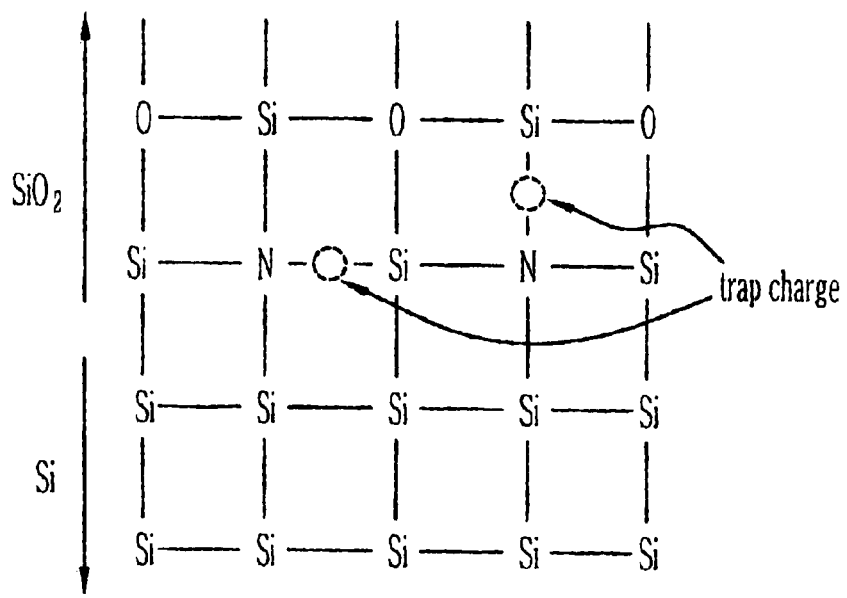
FIG. 4 illustrates that a trap charge is formed at a Si—$SiO_2$ interface after a nitrification process.
Figure 5:
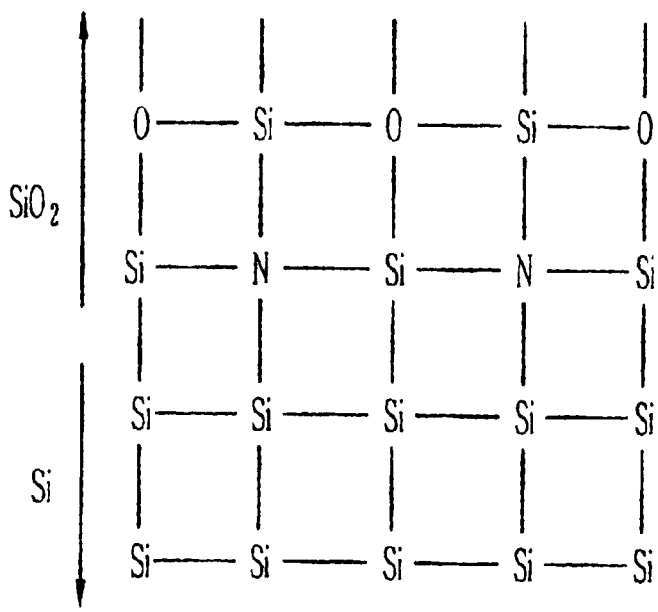
FIG. 5 illustrates that the trap charge is removed and nitrogen is stably substituted after an annealing process.

FIG. 2 illustrates that a silicon oxide ($SiO_2$) film is formed on a silicon substrate, FIG. 3 illustrates that nitrogen is stably substituted at a Si—$SiO_2$ interface by implementing a nitrification process, FIG. 4 illustrates that a trap charge is formed at a Si—$SiO_2$ interface after a nitrification process, and FIG. 5 illustrates that the trap charge is removed and nitrogen is stably substituted after an annealing process.

Referring now to FIG. 2–through FIG. 5, the reason why the density of the trap charge is increased as the concentration of nitrogen at the Si—$SiO_2$ interface is increased is that an interfacial trap charge is generated due to stress occurring while Si—N bonding in lieu of Si—O bonding is formed at the Si—$SiO_2$ interface by nitrogen penetrated into a pure silicon oxide film in a nitrification process. Accordingly, in order to minimize the trap charge of the Si—$SiO_2$ interface, a method capable of reducing by stress occurring while nitrogen is coupled with silicon and oxygen at the Si—$SiO_2$ interface must be sought. In order to solve the above problem, the disclosed method employs a method of relaxing stress by controlling an annealing process condition during the nitrification process or implementing a subsequent annealing process after the nitrification process.

<Embodiment 1>

A method of controlling the annealing process condition during the nitrification process will be first described.

Turning to FIG. 2 and FIG. 3 again, in order to relax stress occurring when nitrogen is injected into the Si—$SiO_2$ interface, it is required that a temperature higher than 950° C. being a viscous flow temperature of the $SiO_2$ film be kept.

If the nitrification process is implemented over this temperature, stress is relaxed due to the mobility of the $SiO_2$ film although nitrogen is substituted in the Si—O bonding, so that generation of the trap charge is fundamentally prevented. Meanwhile, if only $NH_3$, $N_2O$ or NO is used as a source gas when the nitrification process is implemented at high temperature of over 950° C. it would be difficult to implant the amount of nitrogen corresponding to the concentration that is expected for the Si—$SiO_2$ interface or control the thickness of a nitrogen-rich oxide film. This problem could be solved by mixing argon (Ar) being an inert gas or $N_2$ gas with a source gas in an adequate ratio and then implanting the mixture. This will be described in more detail below.

A pure silicon oxide film of a desired thickness is first grown within the oxidization furnace. At this time, the pure silicon oxide film may be formed by means of a wet oxidization process at a temperature of about 750~800° C. After the oxidization process, the source gas is blocked and the inert gas is injected into the oxidization furnace to exhaust all the remaining oxide materials. In succession, in a state that growth of an unwanted oxide film is prevented under the inert gas atmosphere, the temperature is raised higher than 950° C. in order to implement the nitrification process. If the temperature for implementing the nitrification process is stabilized, the nitrification process is implemented by injecting the source gas into the oxidization furnace. At this time, the source gas used may include $NH_3$, $N_2O$, NO, or the like. Also, it is possible that the source gas is diluted with the inert gas such as argon (Ar) or $N_2$ in order to grow an oxide film having the concentration of nitrogen required for the Si—$SiO_2$ interface and a nitrogen-rich oxide film.

After the nitrification process is completed, in a state that the source gas is blocked and only a pure inert gas is injected into the oxidization furnace, the oxidization furnace is cooled as fast as possible. The fast cooling rate does not cause a physical bent or warping phenomenon in the wafer. As the cooling speed of the oxidization furnace is fast, it is effective to prevent reproducibility of the trap charge. At this time, after the pure silicon oxide film is grown in the oxidization furnace if necessary for process constitution, the nitrification process may be implemented in additional equipment in the above procedure.

<Embodiment 2>

A method of implementing a subsequent annealing process after the is nitrification process will be described.

Turning to FIG. 4 and FIG. 5, in a method of removing the trap charge already occurred in the nitrification process through subsequent annealing, if the annealing process is implemented by injecting the inert gas (for instance, Ar, $N_2$, etc.) at a temperature of over a nitrification process temperature, the Si—$SiO_2$ interface having a unstable lattice structure due to nitrogen substitution is reconstructed to have a stable lattice structure, so that the trap charges that were already generated are extinguished.

This will be described in more detail below.

A pure silicon oxide film of a desired thickness is first grown within the oxidization furnace. At this time, the pure silicon oxide film may be formed by implementing a wet oxidization process at a temperature of about 750~800° C. After the oxidization process, a source gas is blocked and an inert gas is injected into the oxidization furnace to exhaust all the remaining oxide materials. In succession, in a state that growth of an unwanted oxide film is prevented under the inert gas atmosphere, the temperature is stabilized for performing a nitrification process. At this time, the nitrification process temperature has no limitation to the lowest temperature unlike the first embodiment and would be okay if it is sufficient to secure a desired nitrification process level. In general, it would be possible if the temperature is over 800° C. After the temperature for the nitrification process is stabilized, a nitrification process is implemented by injecting the source gas into the oxidization furnace. At this time, the source gas used may include $NH_3$, $N_2O$, NO, or the like. Also, it is possible that the source gas is diluted with the inert gas such as argon (Ar) or $N_2$ in order to grow an oxide film having the concentration of nitrogen required for the Si—$SiO_2$ interface and a nitrogen-rich oxide film.

After the nitrification process is completed, the temperature is increased to an annealing process temperature in a state that the source gas flow is shut off and only a pure inert gas is infected into the oxidization furnace to purge any remaining source gas. At this time, the temperature of the annealing process has no problem if it is performed at a temperature of over the nitrification process temperature. Although the effect of removing the trap charge is excellent when the annealing temperature is kept higher than the nitrification temperature and the temperature is adequately controlled considering a thermal budget affecting the device. The annealing process is HIV be implemented under an inert atmosphere such as argon (Ar) or $N_2$. After the process is completed, the oxidization furnace is cooled as fast as possible. The cooling rate at this time should preferably be as fast as possible, which does not cause a physical bent or warping phenomenon in the wafer. As the cooling rate of the oxidization furnace is fast, it is effective to prevent reproducibility of the trap charge. At this time, after the pure silicon oxide film is grown in the oxidization furnace if necessary for process constitution, the nitrification process may be implemented in additional equipment in the above procedure.

As described above, the disclosed method of forming the oxynitride film can be applied to fabricate the tunnel oxide film of the flash memory device or a gate oxide film of other memories or logic devices. In this case, the disclosed method can have new effects that it can secure the characteristics of a film that are significantly improved than those obtained in the conventional pure silicon oxide film, and minimize variation in the threshold voltage of the transistor by a trap charge that is a disadvantage in the existing oxynitride film.

The forgoing embodiments are merely exemplary and are not to be construed as limiting of this disclosure. The present teachings can be readily applied to other types of apparatuses. The description of the disclosed methods is intended to be illustrative, and not to limit the scope of the claims. Many alternatives, modifications, and variations will be apparent to those skilled in the art.

What is claimed is:

1. A method of forming an oxynitride film, comprising:

loading a silicon substrate into an oxidization furnace;

injecting an oxygen based source gas into the oxidization furnace to grow a pure silicon oxide film on the silicon substrate;

stopping the injection of the oxygen based source gas and injecting inert gas into the furnace to purge the oxygen based source gas remaining within the oxidization furnace;

raising a temperature within the oxidization furnace to a nitrification process temperature;

stabilizing the temperature within the oxidization furnace;

implementing a nitrification process for the pure silicon oxide film by injecting a nitrogen based source gas; and stopping the injection of the nitrogen based source gas raising the temperature of the oxidization furnace to a temperature higher than the temperature at which the nitrification process is implemented before rapidly cooling the oxidization furnace while injecting inert gas into the oxidization furnace to thereby purge the nitrogen based source remaining in the furnace.

2. The method as claimed in claim 1, wherein the nitrogen based source gas is a $NH_3$, $N_2O$ or NO gas.

3. The method as claimed in claim 2, wherein when the nitrification process is implemented, Ar or $N_2$ is injected along with the nitrogen based source gas.

4. The method as claimed in claim 1, wherein the temperature at which the nitrification process is implemented is higher than a temperature at which a viscous flow of a $SiO_2$ film occurs to preclude viscous flow of the $SiO_2$ film and to relax stress that results when nitrogen is implanted into a Si—$SiO_2$ interface.

5. The method as claimed in claim 1, wherein the nitrification process is implemented at a temperature higher than 800° C.

* * * * *

UNITED STATES PATENT AND TRADEMARK OFFICE
CERTIFICATE OF CORRECTION

PATENT NO. : 6,777,348 B2
DATED : August 17, 2004
INVENTOR(S) : Seung W. Shin et al.

It is certified that error appears in the above-identified patent and that said Letters Patent is hereby corrected as shown below:

Title page,
Item [75], Inventors, after "Seung Woo Shin," please delete "Ichon-shi" and insert -- Kyungki-Do -- in its place; after "Deok Dong," please delete "Ichon-shi" and insert -- Kyungki-Do -- in its place.

Column 4,
Line 52, please delete "What is claimed is:" and insert -- What is claimed: -- in its place.

Signed and Sealed this

First Day of February, 2005

JON W. DUDAS
*Director of the United States Patent and Trademark Office*